United States Patent [19]

Laker et al.

[11] 4,242,642
[45] Dec. 30, 1980

[54] POLE QUALITY FACTOR (Q) ENHANCEMENT TECHNIQUE FOR NOTCH FILTERS

[75] Inventors: Kenneth R. Laker, Staten Island, N.Y.; Jimmy Tow, Holmdel, N.J.

[73] Assignee: Bell Telephone Laboratories, Incorporated, Murray Hill, N.J.

[21] Appl. No.: 37,299

[22] Filed: May 9, 1979

[51] Int. Cl.³ .................................. H03F 1/34
[52] U.S. Cl. .......................... 330/109; 330/101
[58] Field of Search ........... 330/101, 107, 109, 294, 330/306

[56] References Cited
U.S. PATENT DOCUMENTS 3,223,941  12/1965  Schroeder et al. .............. 330/109

OTHER PUBLICATIONS

Valley et al., *Vacuum Tube Amplifiers*, vol. 18, Published 1948, McGraw-Hill, pp. 391–397.
Revankar et al., "A New High-Q Active Bandpass Filter with Low-Gain Stages," *International Journal of Electronics*, vol. 42, No. 2, Feb. 1977, pp. 111–116.

*Primary Examiner*—James B. Mullins
*Attorney, Agent, or Firm*—Richard B. Havill

[57] ABSTRACT

An enhanced pole quality factor (Q) notch filter section circuit includes an active biquadratic notch filter section and a pole quality factor enhancement amplifier responsive to the output of the biquadratic notch filter section for providing at the input of the biquadratic notch filter section negative feedback in pass and stop bands of frequencies and positive feedback in the transition range of frequencies between the pass and stop bands of frequencies.

15 Claims, 4 Drawing Figures

POLE QUALITY FACTOR (Q) ENHANCEMENT TECHNIQUE FOR NOTCH FILTERS

BACKGROUND OF THE INVENTION

The invention relates to an active notch filter circuit that is more particularly described as an enhanced pole quality factor (Q) active notch filter section.

There are many applications for complex high order filters requiring high pole quality factor (Q) notch filter sections. The filters may use either high-pass notch, low-pass notch, or both high-pass and low-pass notch biquadratic active filter sections.

Each of such filter sections can be fabricated in a module such as a hybrid integrated circuit or as a monolithic integrated circuit chip. Typically, when a filter section is made as a module there is a limit to the maximum value of the pole quality factor $\hat{Q}$ which can be achieved by the section. The maximum value of $\hat{Q}$ for a general purpose modular filter section is chosen after consideration of the range of the pole quality factor most likely to be used in a wide variety of applications together with appropriate circuit component tradeoffs.

Occasionally some particular application may require a filter section having a value of the pole quality factor Q exceeding the maximum value of $\hat{Q}$ for the module at hand. Alternatively there may be a need for a filter section module having a relatively high predetermined maximum value of $\hat{Q}$ while using small resistors. Neither of these applications is accomplished satisfactorily by available techniques.

Therefore it is an object to develop an improved active filter section circuit.

It is another object to provide an active filter section circuit having an enhanced pole quality factor Q.

It is a further object to enhance the pole quality factor $\hat{Q}$ of a modular filter section circuit without using larger than practical values of resistance.

SUMMARY OF THE INVENTION

These and other objects are realized in an enhanced pole quality factor notch filter section including an active biquadratic notch filter section having an input and an output. A pole quality enhancement amplifier has a first input for receiving input signals and the second input for receiving signals fed back from the output of the notch filter section. Output of the enhancement amplifier is coupled to the input of the active biquadratic notch filter section. A feedback network including the enhancement amplifier and in particular the second input thereto is arranged to provide to the input of the active biquadratic notch filter section negative feedback in pass and stop bands of frequencies and positive feedback in a transition range between the pass and stop bands of frequencies.

It is a feature of the invention to provide to an active biquadratic notch filter section negative feedback in pass and stop bands of frequencies and positive feedback in a transition range between the pass and stop bands of frequencies.

It is another feature to utilize a high-pass active notch filter section or a low-pass active notch filter section in combination with a pole quality enhancement amplifier.

It is a further feature to provide a feedback signal $\beta V_{out}$ with a feedback factor $\beta$ determined by equating a voltage transfer function between input and output terminals of the enhancement circuit arrangement with a predetermined voltage transfer function.

It is a still further feature to provide, through an operational amplifier, a notch filter section and a feedback resistor, loop gain equal to $\beta$ times the gain of the notch filter section.

BRIEF DESCRIPTION OF THE DRAWING

The invention may be better understood by reading the following detailed description when that description is read with reference to the accompanying drawing wherein.

DETAILED DESCRIPTION

Figure 1:
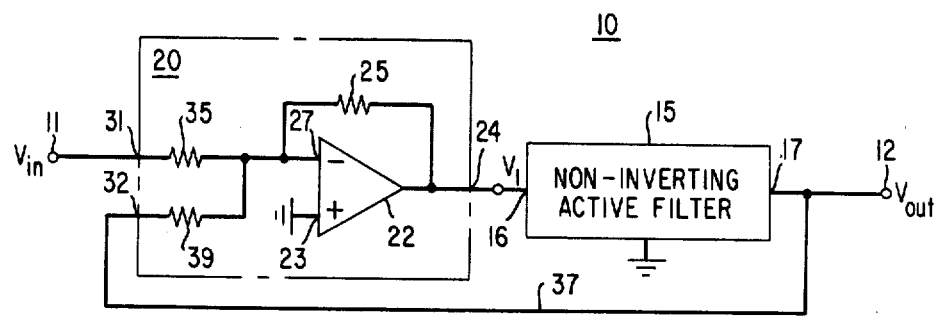
FIG. 1 is a schematic diagram of an enhanced pole quality factor (Q) notch filter section.

Referring now to FIG. 1, there is shown an enhanced pole quality factor (Q) notch filter section, or enhancement circuit arrangement 10, having an input terminal 11 for receiving an input signal $V_{in}$ to be filtered and an output terminal 12 upon which a filtered output signal $V_{out}$ is produced. A grounded non-inverting active biquadratic notch filter section 15 has an input 16 and an output 17. The output 17 is connected directly to the output terminal 12. A pole quality enhancement amplifier 20 includes an operational amplifier 22 having a grounded non-inverting input 23 and an output 24, which is connected directly to the input 16 of the active biquadratic notch filter section 15. A feedback resistor 25 couples the output 24 back to an inverting input 27 of the operational amplifier 22.

The pole quality enhancement amplifier 20 is a weighted input inverting summing amplifier having two inputs 31 and 32. Input 31 is connected directly to the input terminal 11 of the enhancement circuit arrangement 10 and by way of an input resistor 35 is coupled to the inverting input 27 of the operational amplifier 22. Input 32 is connected by way of a feedback lead 37 to the output 17 of the active biquadratic filter section 15 and is coupled through a feedback, or input, resistor 39 to the inverting input 27 of the operational amplifier 22.

The resistors in the enhancement amplifier 20 have resistance values which are interrelated. The feedback resistor 25 has a resistance value R selected so that the resistance values of the resistors in the enhancement amplifier can be manufactured practically. Input resistor 35 has a resistance value kR, wherein k is a constant representing the reciprocal of the amplification between the input terminal 11 and the output 24. Input resistor 39 has a resistance value R/$\beta$, wherein $\beta V_{out}$ is that fraction of the output signal, at the output terminal 12, which is fed back to the input 16 of the active filter section 15.

In FIG. 1 a voltage transfer function for the enhanced pole quality factor notch filter section circuit arrangement 10 is given by the equation $$\frac{V_{out}(s)}{V_{in}(s)} = \frac{-m(s^2 + \omega_z^2)}{s^2 + \frac{\omega_p}{Q_p}s + \omega_p^2} = \frac{-N(s)}{D(s)}. \qquad (1)$$

$V_{out}(s)$ is a Laplace transformed expression for a complex output voltage of the enhanced pole quality factor notch filter section circuit arrangement 10. $V_{in}(s)$ is a Laplace transformed expression for a complex input voltage of the enhanced pole quality factor notch filter section circuit arrangement 10. The symbol m represents a positive constant. The symbol s represents the complex operator used in the Laplace transform. Symbols $\omega_p$ and $\omega_z$ represent angular frequencies respectively for a pole and for a zero. $Q_p$ is the pole quality factor of the enhanced circuit arrangement 10 when it is not loaded. The period of the expression for $Q_p$ is that of the input signal and is not that of energy storage. The expressions N(s) and D(s), respectively, are the numerator and denominator of the voltage transfer function of the enhanced circuit arrangement 10.

Figure 2:
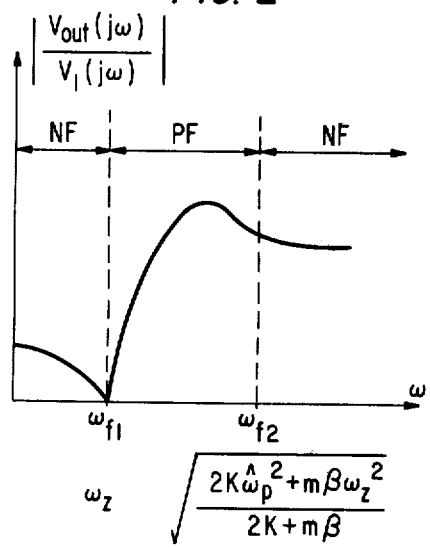
FIG. 2 is a characteristic curve of a high-pass notch filter section.

Referring now to FIG. 2, there is shown a characteristic curve for a high-pass notch filter section which may be inserted as the active filter section 15 in FIG. 1. When the high-pass notch filter section having a characteristic like FIG. 2 is inserted as the active filter section 15 in FIG. 1, $\omega_p$ is greater than $\omega_z$.

The voltage transfer function of that active filter section 15 is $$\frac{V_{out}(s)}{V_1(s)} = \frac{m(s^2 + \omega_z^2)}{K(s^2 + \frac{\hat{\omega}_p}{\hat{Q}_p} s + \hat{\omega}_p^2)} = \frac{N(s)}{D(s)}. \quad (2)$$

$V_1(s)$ is a Laplace transformed expression for a complex input voltage of the active filter section 15. The symbol K is a positive constant. The symbol $\hat{\omega}_p$ is the angular frequency of a pole of the active high-pass notch filter section 15. The symbol $\hat{Q}_p$ is the pole quality factor of the active high-pass notch filter section 15 without a load. The symbol $\hat{D}(s)$ represents the denominator of the voltage transfer function for the active notch filter section 15.

It is noted that for pole quality factor enhancement the factor $Q_p$ is greater than $\hat{Q}_p$.

It also is noted that the use of both constants m and K provides the basis for a systematic design procedure for the enhancement circuit arrangement 10. Obviously, in the filter realization the ratio m/K can be combined into one constant.

In the design procedure, the designer determines a specific enhancement amplifier arrangement to be used with an available modular filter section for producing a specified, or predetermined, filter characteristic having a pole quality factor $Q_p$ that is greater than $\hat{Q}_p$ of the modular filter section. Feedback and loop gain expressions are analyzed to select component values which when inserted in the enhancement amplifier produce the predetermined $Q_p$.

First of all we write an expression for $V_1(s)$ in terms of the input signal $V_{in}(s)$ and the feedback signal $\beta V_{out}(s)$. The resulting expression is substituted in Equation (2) for $V_1(s)$. After subsequent clearing of the equation, we obtain $$\frac{V_{out}(s)}{V_{in}(s)} = \frac{-N(s)/\hat{D}(s)}{1 + \beta N(s)/\hat{D}(s)} = \frac{-N(s)}{\hat{D}(s) + \beta N(s)}. \quad (3)$$

In Equation (3) the scale factor k, which results from the resistance value kR for resistor 35, has been set to unity for simplicity. This scale factor can be used to adjust the overall gain level by 1/k to some desired value at the end of the design process. Also in Equation (3), the negative sign of the numerator results from the inverting input used in amplifier 22. $\beta$ is a feedback factor defining feedback from the output 17 of the notch filter section 15 to the input 16 of the notch filter section. $\beta$ is a positive real number.

Considering Equations (3) and (1), we obtain $$\frac{N(s)}{D(s)} = \frac{-N(s)}{\hat{D}(s) + \beta N(s)}. \quad (4)$$

The expression $-N(s)/D(s)$ is a specified voltage transfer function for the resulting arrangement. The expression $-N(s)/[\hat{D}(s)+\beta N(s)]$ is a voltage transfer function between the input terminal 11 and the output terminal 12 of the enhancement circuit arrangement 10 of FIG. 1.

The denominators of Equation (4) are equal.

Thus, $D(s) = \hat{D}(s) + \beta N(s)$, and $\quad (5)$ $\hat{D}(s) = D(s) - \beta N(s)$. $\quad (6)$ By substitution and collection of like terms, we obtain $$K(s^2 + \frac{\hat{\omega}_p}{\hat{Q}_p} s + \hat{\omega}_p^2) =$$

$$s^2 + \frac{\omega_p}{Q_p} s + \omega_p^2 - m\beta(s^2 + \omega_z^2) = \quad (7)$$

$$(1 - m\beta)s^2 + \frac{\omega_p}{Q_p} s + \omega_p^2 - m\beta\omega_z^2 = \quad (8)$$

$$(1 - m\beta)(s^2 + \frac{\omega_p}{Q_p(1 - m\beta)} s + \frac{(\omega_p^2 - m\beta\omega_z^2)}{(1 - m\beta)}). \quad (9)$$

By equating the coefficients of the various powers of s in Equation (9), we find that $$K = (1 - m\beta) > 0, \quad (10)$$

$$\frac{\hat{\omega}_p}{\hat{Q}_p} = \frac{1}{(1 - m\beta)} \cdot \frac{\omega_p}{Q_p}, \text{ and} \quad (11)$$

$$\hat{\omega}_p^2 = \omega_p^2 \frac{(1 - m\beta \frac{\omega_z^2}{\omega_p^2})}{(1 - m\beta)}. \quad (12)$$

From the foregoing expressions, it is possible to derive the value of the feedback factor $\beta$. From Equations (11) and (12)

$$\frac{\hat{Q}_p}{Q_p} = (1 - m\beta) \frac{\hat{\omega}_p}{\omega_p} = (1 - m\beta) \sqrt{\frac{(1 - m\beta \frac{\omega_z^2}{\omega_p^2})}{(1 - m\beta)}}. \quad (13)$$

We define a pole-Q reduction factor $\eta = Q_p/\hat{Q}_p$.

$$\frac{1}{\eta} = (1 - m\beta) \sqrt{\frac{(1 - m\beta \frac{\omega_z^2}{\omega_p^2})}{(1 - m\beta)}} \quad (14)$$

Squaring both sides of Equation (14), and collecting terms as powers of $\beta$, we obtain $$\beta^2 - \frac{1}{m}(1 + \frac{\omega_p^2}{\omega_z^2})\beta + \frac{\omega_p^2}{m^2\omega_z^2}(1 - \frac{1}{\eta^2}) = 0 \quad (15)$$

which is a biquadratic equation in terms of $\beta$. By use of the well known formula for determining the roots of a biquadratic equation, the value of the feedback factor $\beta$ can be shown to be $$\beta = \frac{1}{2m}\left\{(1 + \frac{\omega_p^2}{\omega_z^2}) - \sqrt{(1 - \frac{\omega_p^2}{\omega_z^2})^2 + 4\frac{\omega_p^2}{\omega_z^2}(\frac{1}{\eta})^2}\right\}. \quad (16)$$

Of the usual plus and minus signs in front of the square root term, the minus sign is selected so that $\beta=0$ when $1/\eta=1$ and $\beta$ is positive when $1/\eta<1$.

In practical applications, one begins with specified values for the parameters $\omega_p$, $Q_p$, m and $\omega_z$ in a specified, or predetermined enhanced pole quality factor active notch filter section. From an available active filter section module, one can choose a realizeable pole quality factor $\hat{Q}$, where $Q>\hat{Q}$. Equations (16) and (10) through (12) can then be used to obtain the design parameters. From Equation (16), the feedback factor $\beta$ is always positive and real.

Poles of the enhancement circuit arrangement 10 are restricted to lie in the stable left-half plane of the complex s-plane and only lie on the $j\omega$ axis as the feedback factor $\beta$ approaches infinity. This can be established by evaluating the denominators of Equation (3) to show that $$D(s) = \hat{D}(s) + \beta N(s) \quad (17)$$
$$= (K + m\beta)(s^2 + \frac{K}{(K + m\beta)}\frac{\omega_p}{\hat{Q}_p}s + \frac{(K\omega_p^2 + m\beta\omega_z^2)}{(K + m\beta)})$$
$$= (K + m\beta)(s + \sigma + j\gamma)(s + \sigma - j\gamma).$$

For absolute stability $\sigma<0$. For finite values of $\beta$, $$\sigma = -\frac{1}{2}\frac{K}{(K + m\beta)}\frac{\hat{\omega}_p}{\hat{Q}_p}. \quad (18)$$

For K, m, $\beta$, $\hat{\omega}_p$ and $\hat{Q}_p$ all real, non-negative quantities, $\sigma \to 0$ as $\beta \to \infty$ and $\sigma<0$ for $\beta<\infty$.

$$\gamma = \sqrt{\frac{(K\hat{\omega}_p + m\beta\omega_z^2)}{(K + m\beta)} - \frac{1}{4}\frac{K^2\hat{\omega}_p^2}{(K + m\beta)^2\hat{Q}_p^2}}. \quad (19)$$

Hence, $\gamma \to \omega_z$ as $\beta \to \infty$. $\beta V_{out}$ is the amount of signal fed back from the output 17 of the notch filter section 15 to the input 16 of the notch filter section in FIG. 1.

The feedback arrangement in FIG. 1 has some interesting properties. The feedback signal is frequency dependent and exhibits negative polarity, positive polarity and zero magnitude at different frequencies, as frequency varies from zero to infinity. To examine these properties consider the characteristic equation $$F(j\omega) = 1 + \beta N(j\omega)/\hat{D}(j\omega) \quad (20)$$

obtained from Equation (3), where $\beta N(j\omega)/\hat{D}(j\omega)$ is the loop gain through operational amplifier 22, notch filter section 15, and feedback resistor 39 in the enhancement circuit arrangement 10. The magnitude of $F(j\omega)$ determines both the form and the amount of feedback. From Equations (2) and (9), we can express the magnitude $|F(j\omega)|$ in the following form $$|F(j\omega)| = \quad (21)$$
$$\sqrt{1 + \frac{m\beta(2K + m\beta)}{|\hat{D}(j\omega)|^2}(\omega_z^2 - \omega^2)(\frac{(2K\hat{\omega}_p^2 + m\beta\omega_z^2)}{(2K + m\beta)} - \omega^2)}$$

where $|F(j\omega)|$ represents the magnitude of the return difference for the enhancement circuit arrangement 10. The symbol $\omega$ is a variable representing angular frequency throughout the spectrum.

It is noted that two critical frequency points occur when the return difference $|F(j\omega)| = 1$, that is when the loop gain equals zero. These critical frequency points are displayed in FIG. 2 relative to the characteristic curve for the high-pass notch filter section. The first of these critical points occurs at the location of the zero $\omega_z$ which is also designated $\omega_{f1}$. The second of these critical points occurs at another location which is designated $\omega_{f2}$.

By writing Equation (21) accordingly, we find $$\sqrt{1 + \frac{m\beta(2K + m\beta)}{|\hat{D}(j\omega)|^2}(\omega_{f1}^2 - \omega^2)(\omega_{f2}^2 - \omega^2)}. \quad (22)$$

In solving for the angular frequency $\omega$ when $|F(j\omega)| = 1$, we determine that $$\omega_{f2} = \sqrt{\frac{2K\hat{\omega}_p^2 + m\beta\omega_z^2}{2K + m\beta}}. \quad (24)$$

In FIG. 2, there are dotted vertical lines at the locations $\omega_{f1}$ and $\omega_{f2}$.

As previously mentioned, the nature of the feedback is frequency dependent. The locations $\omega_{f1}$ and $\omega_{f2}$ in FIG. 2 divide the frequency spectrum into three distinct ranges. In the pass band range of frequencies above $\omega_{f2}$ and in the stop band range of frequencies below $\omega_{f1}$, $|F(j\omega)|$ is greater than one and negative feedback (NF) occurs. For $\omega=\omega_{f1}$ and $\omega=\omega_{f2}$, $|F(j\omega)|=1$ which implies zero feedback. In the range of frequencies between the stop and pass bands of frequencies, $|F(j\omega)|$ is less than one and positive feedback (PF) occurs.

The foregoing concludes the discussion of the enhancement circuit arrangement 10 of FIG. 1 including a non-inverting high-pass notch filter section 15 with a characteristic as shown in FIG. 2.

Figure 3:
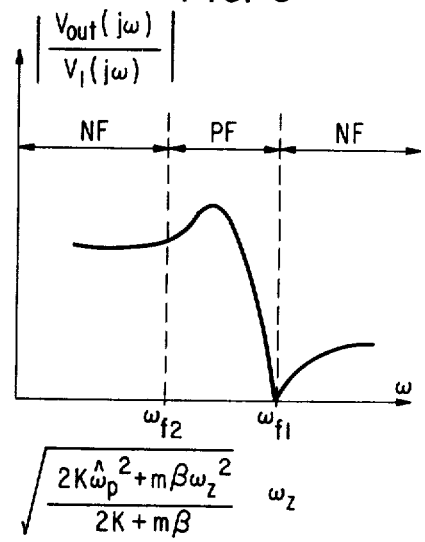
FIG. 3 is a characteristic curve of a low-pass notch filter section.

Another configuration of the enhancement circuit arrangement 10 includes a non-inverting low-pass notch filter section 15 with a characteristic as shown in FIG. 3. The expressions derived and presented hereinbefore apply directly to this configuration except that negative feedback occurs in the stop band range of frequencies above $\omega_{f1}$, as shown in FIG. 3, and in the pass band range of frequencies below $\omega_{f2}$, as shown in FIG. 3. Positive feedback still occurs in the range of frequencies between the pass and stop bands of frequencies, and zero feedback still occurs at the frequencies $\omega_{f1}$ and $\omega_{f2}$.

Figure 4:
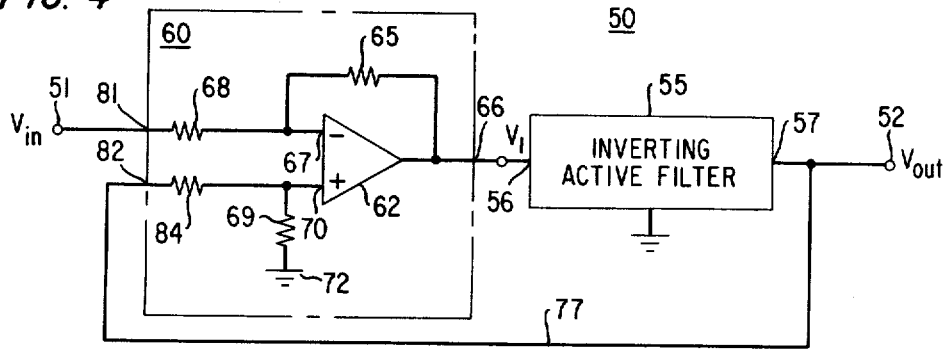
FIG. 4 is a schematic diagram of an alternative enhanced pole quality factor (Q) notch filter section.

Referring now to FIG. 4, there is shown another circuit arrangement embodying the invention. In FIG. 4, an enhanced pole quality factor Q notch filter section, or circuit arrangement 50 includes an input terminal 51 for receiving an input signal $V_{in}$ to be filtered and an output terminal 52 upon which a filtered output signal $V_{out}$ is produced. An inverting active biquadratic notch filter section 55 has an input 56 and an output 57. An enhancement amplifier 60 is a weighted active summer including an operational amplifier 62. A feedback resistor 65 has a resistance R coupling output 66 of the operational amplifier 62 to an inverting input 67 thereof. Output 66 is connected directly to the input 56 of the inverting active notch filter section 55. An input resistor 68, having a resistance kR, is connected with an input terminal 81 of the enhancement amplifier 60 and the input terminal 51 for coupling the input terminal 51 of the enhancement circuit arrangement to the input 67 of the operational amplifier 62. A reference resistor 69, having a resistance kR, couples a non-inverting input 70 of the operational amplifier 62 to ground reference potential 72. A feedback lead 77 couples the output 57 of the inverting active notch filter section 55 to another input terminal 82 of the enhancement amplifier 60. Another feedback, or input, resistor 84 having a resistance equal to $(1+k-k\beta)R/\beta$ couples the input terminal 82 to the non-inverting input 70 of the operational amplifier 62. Any output signal $V_{out}$ produced at the output 57 is fed back through the lead 77, the resistor 84, and the operational amplifier 62 to the input 56 of the inverting active notch filter section 55.

The enhancement circuit arrangement 50 of FIG. 4, can be analyzed with either a high-pass notch filter section, having a characteristic as shown in FIG. 2, or a low-pass notch filter section, having a characteristic as shown in FIG. 3, inserted as the inverting active notch filter section 55. Interestingly the analyses result in expressions just like those previously derived with respect to the enhancement circuit arrangement 10 of FIG. 1. Note that the voltage transfer function of the inverting active filter section 55 is also represented by Equation (2) with the exception that constant K is negative.

Inasmuch as the analyses are like the analysis relating to FIG. 1, we refer the reader back to that discussion for completeness.

The foregoing description describes several embodiments of the invention. The scope of the invention is considered to include the described embodiments together with additional embodiments which are obvious to those skilled in the art.

We claim:

1. An enhanced pole quality factor Q notch filter section circuit comprising
   input and output terminals,
   a biquadratic notch filter section having an input and an output, the output of the biquadratic notch filter section being connected to the output terminal, and
   an enhancement amplifier having first and second inputs and an output, the first input of the amplifier being connected to the input terminal and the second input of the amplifier being connected to the output of the biquadratic notch filter section, the output of the enhancement amplifier being connected with the input of the biquadratic notch filter section for providing at the input of the biquadratic notch filter section negative feedback in pass and stop bands of frequencies and positive feedback in a transition range between the pass and stop bands of frequencies.

2. A Q enhancement circuit arrangement comprising input and output terminals;
   an inverting notch filter section having an input and an output, the output of the inverting notch filter section being connected to the output terminal; and
   a weighted active summer including an operational amplifier arranged with a first feedback resistance R connected between an output of the operational amplifier and an inverting input of the operational amplifier, an input resistance kR connected between the input terminal and the inverting input of the operational amplifier, a reference resistance kR connected between a reference potential and a non-inverting input of the operational amplifier, and the output of the operational amplifier connected to the input of the inverting notch filter section, and a second input resistance $(1+k-k\beta)R/\beta$ connected between the output of the inverting notch filter section and the non-inverting input of the operational amplifier, wherein a feedback signal $\beta V_{out}$ is a fraction of an output signal $V_{out}$ from the inverting notch filter section, which fraction is fed back to the input of the inverting notch filter section.

3. A Q enhancement circuit arrangement in accordance with claim 2 wherein
   the inverting notch filter section has a low-pass characteristic.

4. A Q enhancement circuit arrangement in accordance with claim 3 wherein the magnitude of feedback factor $\beta$ is determined by equating a voltage transfer function between the input and output terminals of the enhancement circuit arrangement with a predetermined voltage transfer function.

5. A Q enhancement circuit arrangement in accordance with claim 4 wherein from the non-inverting input of the operational amplifier through the operational amplifier, the inverting low-pass notch filter section and the second input resistance to the non-inverting input of the operational amplifier, loop gain equals $\beta$ times the gain of the inverting low-pass notch filter section.

6. A Q enhancement circuit arrangement in accordance with claim 2 wherein
   the inverting notch filter section has a high-pass characteristic.

7. A Q enhancement circuit arrangement in accordance with claim 6 wherein the magnitude of feedback factor $\beta$ is determined by equating a voltage transfer function between the input and output terminals of the enhancement circuit arrangement with a predetermined voltage transfer function.

8. A Q enhancement circuit arrangement in accordance with claim 7 wherein from the non-inverting input of the operational amplifier through the operational amplifier, the inverting high-pass notch filter section and the second input resistance to the non-inverting input of the operational amplifier, loop gain equals $\beta$ times the gain of the inverting high-pass notch filter section.

9. A Q enhancement arrangement comprising
   input and output terminals;
   a non-inverting notch filter section having an input and an output, the output of the non-inverting notch filter section being connected to the output terminal; and
   a weighted input inverting summing amplifier including an operational amplifier arranged with a first feedback resistance R connected between an output of the operational amplifier and an inverting input of the operational amplifier, a first input resistance kR connected between the input terminal and the inverting input of the operational amplifier, a direct connection between a non-inverting input of the operational amplifier and a reference potential, and a direct connection between the output of the operational amplifier and the input of the non-inverting notch filter section, and a second input resistance R/β connected between the output of the non-inverting notch filter section and the inverting input of the operational amplifier, wherein a feedback signal βV$_{out}$ is a fraction of an output signal V$_{out}$ from the non-inverting notch filter section, which fraction is fed back to the input of the non-inverting notch filter section.

10. A Q enhancement circuit arrangement in accordance with claim 9 wherein
the non-inverting notch filter section has a low-pass characteristic.

11. A Q enhancement circuit arrangement in accordance with claim 10 wherein the magnitude of feedback factor β is determined by equating a voltage transfer function between the input and output terminals of the enhancement circuit arrangement with a predetermined voltage transfer function.

12. A Q enhancement circuit arrangement in accordance with claim 11 wherein from the inverting input of the operational amplifier through the operational amplifier, the non-inverting low-pass notch filter section and the second input resistance to the inverting input of the operational amplifier, loop gain equals β times the gain of the non-inverting low-pass notch filter section.

13. A Q enhancement circuit arrangement in accordance with claim 9 wherein
the non-inverting notch filter section has a high-pass characteristic.

14. A Q enhancement circuit arrangement in accordance with claim 13 wherein the magnitude of feedback factor β is determined by equating a voltage transfer function between the input and output terminals of the enhancement circuit arrangement with a predetermined voltage transfer function.

15. A Q enhancement circuit arrangement in accordance with claim 14 wherein from the inverting input of the operational amplifier through the operational amplifier, the non-inverting high-pass notch filter section and the second input resistance to the inverting input of the operational amplifier, loop gain equals β times the gain of the non-inverting high-pass notch filter section.

* * * * *